United States Patent [19]
Knoop et al.

[11] Patent Number: 5,617,299
[45] Date of Patent: Apr. 1, 1997

[54] CONNECTING REAR WALL FOR SUBRACKS

[75] Inventors: Franz-Josef Knoop, Büren-Steinhausen; Ludger Gockel, Paderborn, both of Germany

[73] Assignee: Siemens Nixdorf Informationssysteme Aktiengesellschaft, Paderborn, Germany

[21] Appl. No.: 525,675

[22] PCT Filed: Feb. 10, 1994

[86] PCT No.: PCT/DE94/00138

§ 371 Date: Sep. 25, 1995

§ 102(e) Date: Sep. 25, 1995

[87] PCT Pub. No.: WO94/22283

PCT Pub. Date: Sep. 29, 1994

[30] Foreign Application Priority Data

Mar. 22, 1993 [DE] Germany ............... 43 09 172.5

[51] Int. Cl.[6] ............................................ H05K 7/14
[52] U.S. Cl. ................ 361/788; 439/55; 439/97; 361/794
[58] Field of Search ................... 439/55, 92, 95, 439/97, 109; 361/733, 753, 788, 794, 799, 803

[56] References Cited

U.S. PATENT DOCUMENTS

| | | | |
|---|---|---|---|
| 3,992,686 | 11/1976 | Canning | 361/788 |
| 5,023,754 | 6/1991 | Aug et al. | 361/788 |

FOREIGN PATENT DOCUMENTS

| | | |
|---|---|---|
| 0236799 | 9/1987 | European Pat. Off. |
| 0311706 | 4/1989 | European Pat. Off. |
| 3608046 | 9/1987 | Germany |

*Primary Examiner*—P. Austin Bradley
*Assistant Examiner*—T. C. Patel
*Attorney, Agent, or Firm*—Hill, Steadman & Simpson

[57] ABSTRACT

The invention relates to a connecting rear wall (10) for subracks in electronic systems. Metal plates (14, 16) are mounted parallel to a wiring board (12) by being screwed thereto and simultaneously serve to feed the supply voltages and to screen high-frequency interferences. Cutouts (26) and openings (A) in the metal plates (14, 16) have a maximum dimension which does not exceed 1/10 to 1/20 of the wavelength of the interference signal of highest frequency which is to be screened.

16 Claims, 1 Drawing Sheet

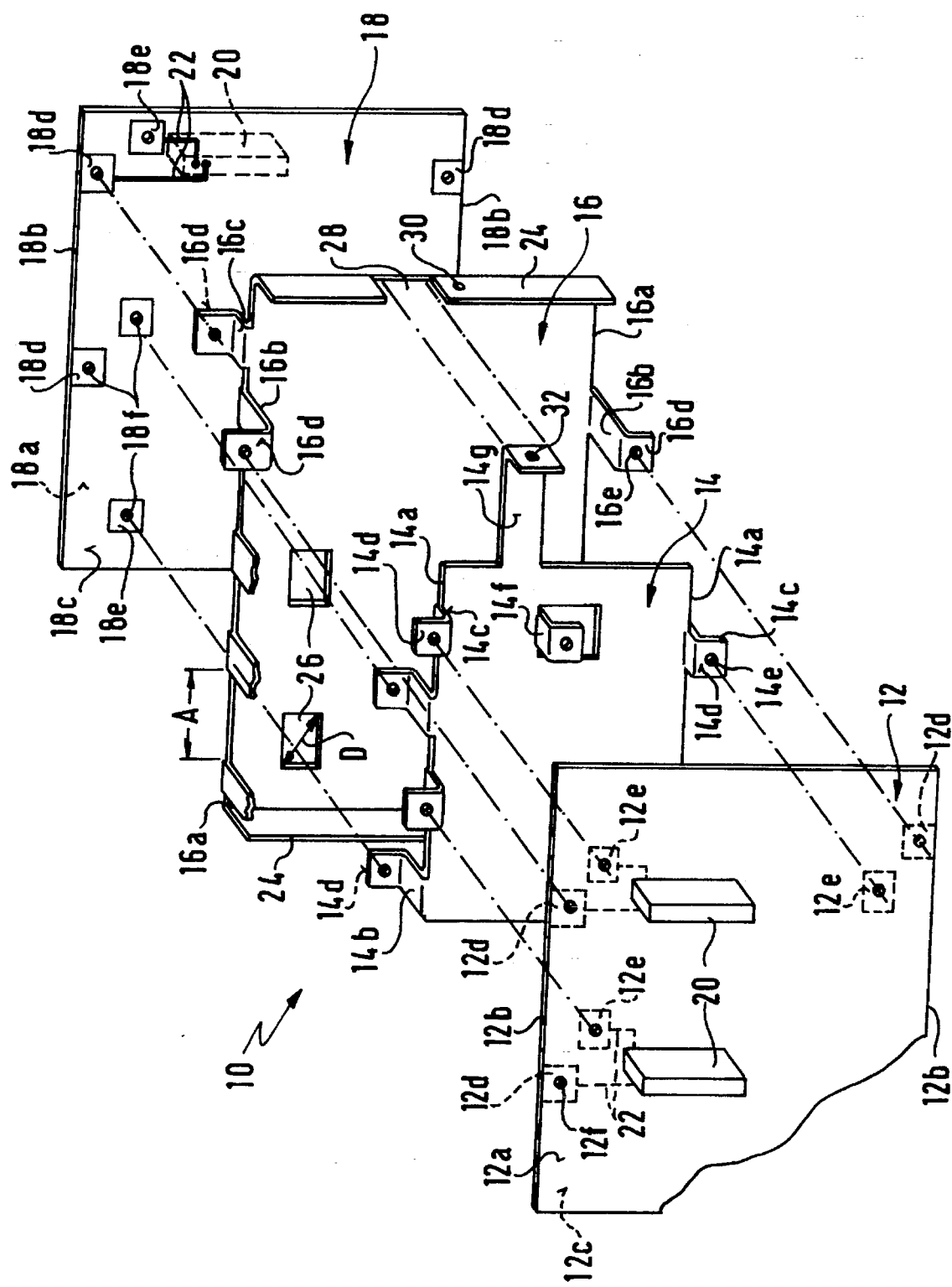

CONNECTING REAR WALL FOR SUBRACKS

BACKGROUND OF THE INVENTION

The invention relates to a connecting rear wall having plug-and-socket devices arranged on a connecting board for making mutual contact between electronic and/or electromechanical plug-in modules in subracks, and having the potential leads of at least one power supply unit.

Modules assembled using plug-in design and operated with one another in a subrack are in general use, in particular for equipment in data systems technology. High demands are placed on this equipment with regard to the suppression of high-frequency interfering radiation. Since the production of such interference on the modules cannot be avoided, the latter and/or the subrack are generally designed as a screening cage.

A problem arising in this case is the connecting rear wall, which on the one hand leaves the rear of the subrack open, and on the other hand carries connecting lines which act as transmitting antennas for the interfering radiation. It is difficult to screen them, in particular in the case of subracks into which modules can be plugged from two opposites sides and in the case of which, therefore, the connecting rear wall is situated in the middle of the subrack. Such a subrack is disclosed, for example, in DE 36 08 046 A1. It is already known from U.S. Pat. No. 3,992,686 to construct the connecting rear wall as a multi-layer printed circuit board, and in this case to use one layer to carry the zero potential and thus as a large-area high-frequency screen (ground plane). A further layer carries a supply voltage.

It is disadvantageous in this arrangement that the screen has as small cross-sectional area, and is thus generally—although mostly at zero potential—suitable only conditionally as a current-carrying conductor for the power supply. The same holds for the layer carrying the supply voltage. Consequently, use is made in addition of conductors of relatively large cross-section to carry the current. However, from the point of view of electronic engineering, the latter form with the screen potential loops which can often be mastered only with difficulty.

It is an object of the invention to provide a connecting rear wall of the type mentioned at the beginning which has an improved screening effect against high-frequency interfering radiation, and is simple to disassemble for the purpose of enabling ease of recycling.

SUMMARY OF THE INVENTION

The present invention achieves the aforementioned objects by providing an improved connecting rear wall. According to an embodiment of the invention, at least one connecting board is provided, each having receptacles for receiving plug-in modules. At least two metal plates are provided and arranged in a spaced parallel, stacked manner relative to the connecting boards. For example, in an embodiment including two connecting boards, the metal plates are arranged between the connecting boards. Each metal plate is connected to a respective voltage source. At least one metal plate carries a ground potential, and another carries a supply voltage. A plurality of contact areas are disposed on each connecting board, which are operably connected to the plug-in receptacles. The metal plates have lugs, each of which is essentially a Z-shaped bend forming an offset end face positioned to contact an associated one of the contact areas. The Z-shaped lugs pass through cutouts or through-openings in the other plates at a predetermined clearance distance.

In a preferred embodiment, the metal plate carrying ground potential is larger than the supply voltage plate. The larger plate has bent ends to partially surround the smaller plate for improved shielding and interference reduction.

In an embodiment, more than two metal plates can be provided. In such an embodiment, two or more supply voltage levels can be provided to the connecting boards.

The metal plates serve in this arrangement simultaneously as a screen and as a single conductor in each case for the supply currents and their return. Since, by contrast with the printed conductor tracks, they can be provided with a substantial cross section—it is easy to realize plate thicknesses in the mm range—the current is conducted with minimum resistance and low inductance. A very fast discharge of pulsating interference currents is thus provided, with the result that it is not possible for high pulsed voltages to build up. Consequently, even steep pulse edges are possible, resulting in an increase in the cut-off frequency of the system.

The respective potentials are led via connecting elements of large cross section to contact surfaces on the connecting board and from there to the contacts of the adjacent plug-and-socket devices. This arrangement likewise represents a connection having a low resistance and low inductance. In the sense of an advantageous double effect, the connecting elements serve simultaneously to mount the metal plates on the connecting board at a spacing prescribed by their height.

In an embodiment of the invention, the connecting elements are integrally formed in one piece on the metal plates as freely stamped lugs. The lugs obtain their function as spacers by means of Z-shaped offsetting.

Fastening holes are introduced into the surfaces of the connecting elements which bear in the assembled state on the contact surfaces. When the abovementioned lugs are used as connecting elements, it is preferable at the same time as the free-stamping operation to form holes with passages which are aligned with holes, arranged in the contact surface region, in the connecting board. Self-tapping screws are screwed into the fastening holes through these holes. The screwing effects a pressure weld between the metals of the contact surfaces and the fastening elements, and thus a gas-tight, corrosion-resistant connection between the two.

The metal plate near the connecting board is preferably smaller than the respectively adjacent one which is further removed. As a result, these are enclosed between the connecting board and the outermost metal plate, which carries frame potential. This has the advantages that from the point of view of interference suppression there is less need to pay attention to the plates situated inside, and that connections between the individual plates and the connecting board do not cross one another.

However, this is possible only as long as only one connecting board is used. In order to use the advantages of the present invention, the aim in the abovementioned double sided subrack is for the connecting rear wall to be fitted with two connecting boards lying on their outer sides.

If both connecting boards are supplied with voltage from the same metal plates, their number is not increased.

In this case, both the connecting boards are preferably connected to the metal plates in the way described above for one connecting board, that is to say they are screwed to the latter via connecting elements. For this purpose, when Z-shaped offset lugs are used one part of the latter is bent towards one and the other one connecting board.

Further features and advantages of the invention follow from the description below which, in conjunction with the drawing, explains the invention with the aid of an exemplary embodiment.

BRIEF DESCRIPTION OF THE DRAWINGS

The FIGURE shows a diagrammatic perspective exploded representation of a connecting rear wall.

DETAILED DESCRIPTION OF THE PRESENTLY PREFERRED EMBODIMENTS

The connecting rear wall represented in the FIGURE and denoted in general by 10 comprises a first connecting board 12, a first metal plate 14, a second metal plate 16 and a second connecting board 18. The number of the metal plates corresponds to the number of different supply voltage potentials. The number of the metal plates increases in the case of more than one supply voltage. The connecting boards are multi-layer printed circuit boards. Arranged in each case on the outer surfaces 12a and 18a, pointing away from one another, of the connecting boards 12 and 18, respectively, is a number, corresponding to the number of the plug-in modules to be contacted (not represented), of plug-and-socket devices 20, of which for reasons of clarity only some are represented. Applied as printed conductor areas along the longitudinal edges 12b, 18b of the connecting boards 12 and 18 on their mutually facing inner faces 12c, 18c are contact areas 12d and 18d, respectively, which serve the purpose of connecting the chassis ground. Further contact areas 12e, 18e, which are arranged offset with respect to the first named Contact areas and away from the longitudinal edges 12b and 18b, respectively, in the direction of the center of the connecting boards 12 and 18, respectively, serve to connect a supply voltage. As indicated in the case of 22, the contact areas are connected by means of conductor tracks to contacts, provided for the power supply, of the plug-and-socket devices 20. At the point of intersection of the diagonals through the contact areas, the connecting boards 12, 18 are provided with through holes 12f, 18f.

The metal plates 14, 16 are, for example, each made of a 1.5 mm thick, tin-plated copper sheet. Lugs 14b, 14c and 16b, 16c, respectively, are integrally formed in one piece on the longitudinal edges 14a and 16a of the metal plates 14 and 16, respectively. The lugs are respectively of different length and are offset in a Z-shape fashion: the long lugs 14b and the short lugs 16c in the direction of the second connecting board 18; the short lugs 14c and the long lugs 16b in the direction of the first connecting board 12. The end faces 14d, 16d of the lugs 14b, 14c, 16b, 16c are provided with fastening holes 14e, 16e.

Edge regions of the second metal plate 16, which carries frame potential, which bear no lugs—these are the vertical edges 24 in the exemplary embodiment—are bent up in the direction of the first metal plate 14, which carries the supply voltage. As a result, the first metal plate is essentially enclosed by the second metal plate 16.

The frame potential is fed to the second metal plate 16 via a screwed connection (not represented) which is to be mounted on the right-hand edge 24. Only a threaded hole 30 is represented in the FIGURE. The other supply potential is fed to the first metal plate 14 via a terminal tab 14g which is integrally formed in one piece on said metal plate and bears a threaded hole 32. The terminal tab 14g projects through a cutout 28 in the right-hand edge 24. Feeding can be performed via cables of large cross section or busbars.

In order to permit the lugs 14b to be lead to the second connecting board 18, cutouts 26 are stamped in the second metal plate 16. Their position and dimensions are selected such that the end faces 14d of the lugs 14b can pass through the cutouts 26, and that in relation to the edges of the cutouts the lugs do not fall below the spacing prescribed for the potential difference between the two.

Lugs can be constructed not only on the edges of the metal plates. A lug 14f is formed on the surface of the metal plate 14 by being stamped free on three sides and then being offset in a Z-shaped fashion. As a result, it is possible to establish contacts between metal plates and connecting boards at any desired point, something which greatly eases the design of the conductor pattern on the connecting boards.

The prescribed configuration of the metal plates allows them to be produced economically: the stamping out of the plates, the stamping free of the lugs and the stamping of the fastening holes, the offsetting of the lugs and the bending up of edge regions can be performed in a single combined stamping and bending operation. In this case, the fastening holes can be formed using the plunging method. As is known per se for this method, there are then formed on the side of the end faces 14d, 16d which faces the respective contact area 12d, 12e, 18d, 18e funnel-shaped burrs which permit a larger number of threads in the fastening holes 14e, 16e.

In order not to worsen the good screening effect of the metal plate 16 carrying frame potential, the largest clear dimension of the cutouts 26, their diagonals D and the spacing A between the lugs 16b and 16c and between the lugs 16b and the bent up edges 24 are selected such that these do not exceed 1/10 to 1/20 of the wavelength of the signal of highest frequency to be screened. This is 30 mm in the exemplary embodiment.

Inserted between the metal plates 14, 16 is an insulating foil (not represented), which has a high dielectric constant. Even without this foil, when separated only by an air gap, the metal plates form the foils of a capacitor. By using the aforementioned foil, the latter can be brought even closer together, resulting in a rise in the capacitance. The dielectric constant of the foil, which is higher by comparison with air, increases the capacitance even further.

At the prevailing high frequencies of the interferences, capacitance between the metal plates suffices to discharge to ground the interferences astray on the supply voltages. The metal plates represent a large-area capacitor which it is necessary to regard as being formed from many immediately adjacent elementary capacitancies which are connected in parallel via link elements. If interference is produced on a metal plate carrying potential, it is discharged to the metal plate carrying frame potential from the elementary capacitance located directly at the production site and its neighbor. As a result, stray interference on the connecting lines between the metal plates and the power supply unit is effectively suppressed.

The connecting rear wall 10 is assembled as follows: self-tapping screws (not represented) are plugged through the through-holes 12f from the outside surface 12a of the first connecting board 12 and screwed into the fastening holes 14e of the lugs 14c, 14f integrally formed on the first metal plate 14, it being the case that they form a thread in these. The assignment of the through holes to the corresponding fastening holes is indicated by dashed and dotted lines.

It should be understood that various changes and modifications to the presently preferred embodiments will be apparent to those skilled in the art. Such changes and modifications may be made without changing the spirit and scope of the present invention and without diminishing its attendant advantages. Therefore, such changes and modifications are intended to be covered by the appended claims.

After the metal plate 14 has been screwed to the first connecting board 12, an insulating foil (not represented) is laid onto the former and the second metal plate 16 is laid onto said foil and screwed to the first connecting board 12 in the way described for the first metal plate. Subsequently, the second connecting board 18 is screwed in the same way onto the end faces 14d, 16d, facing it, of the lugs 14b and 16c.

A positive further effect in addition to the good interference immunity of the connecting rear wall 10 is to be seen in that its design permits disassembly using simple tools. The connecting rear wall 10 then comes apart into its individual parts, which can easily be sorted into material groups, since neither soldered connections nor any sort of bonded connections need to be separated. This meets the requirement to be able to recycle electronic systems.

What is claimed is:

1. A connecting rear wall comprising:
    a first connecting board for making mutual contact with plug-in modules in subracks;
    at least two metal plates parallel to and at a distance from one another and the first connecting board and cover the first connecting board at least partially, each metal plate carrying a respective voltage potential;
    a plurality of contact areas on the first connecting board operably connected to plug-and-socket devices on the first connecting board;
    a plurality of connecting elements on each metal plate, each connecting element being arranged to contact an associated one of the contact areas.

2. The connecting rear wall as claimed in claim 1, wherein each connecting element is a free lug integral to the respective metal sheet and offset in a Z-shape fashion perpendicular to the plane of the first connecting board.

3. The connecting rear wall as claimed in claim 1, each connecting element having an end face bearing in the assembled state against an associated one of the contact areas, each end face having a fastening hole and each contact area having a through-hole aligned with said associated fastening hole, the first connecting board being screwed to the connecting elements by a self-tapping screw secured through each through-hole and associated fastening hole.

4. The connecting rear wall as claimed in claim 1, further comprising an insulating foil inserted between the metal plates.

5. The connecting rear wall as claimed in claim 1, wherein a first one of the metal plates is disposed adjacent the first connecting board and wherein a second one of the metal plates is configured to substantially enclose the first metal plate, generally covering the first connecting board and carrying frame potential.

6. The connecting rear wall as claimed in claim 5, wherein some of the connecting elements are separated by a spacing not less than a predetermined value and are arranged at least on one edge of the second metal plate, remaining edge regions being bent toward the first connecting board.

7. The connecting rear wall as claimed in claim 6, wherein the second metal plate is connected to its voltage potential at an edge region and the first metal plate has a terminal tab integrally formed and projecting through a cutout in the edge region and carrying the voltage potential associated with the first metal plate, the voltage potential being provided through screwed connections to the terminal tab.

8. The connecting rear wall as claimed in claim 5, wherein the maximum clear dimension of the through openings and the spacing between the connecting elements on the edge of the largest metal plate are no more than about $1/10$ to $1/20$ of the wavelength of the interference signal of highest frequency.

9. The connecting rear wall as claimed in claim 5, wherein a second connecting board is mounted parallel to and at a spacing from the second metal plate on the rear thereof.

10. The connecting rear wall as claimed in claim 9, wherein one of the first and second metal plates provide the power to the first and second connecting boards.

11. The connecting rear wall as claimed in claim 9 further comprising additional lugs integrally formed on the metal plates which are offset in a Z-shaped fashion perpendicular to the plane of the second connecting board.

12. The connecting rear wall as claimed in claim 11, wherein through openings are provided in each plate for connecting elements of the other metal plates, edges of the through openings having no less than a predetermined minimum spacing from the connecting elements prescribed for the respective potential difference.

13. The connecting rear wall as claimed in claim 11 wherein the additional lugs arranged on the edges of the largest metal plate have a mutual spacing not less than a permissible value.

14. A connecting rear wall comprising:
    at least one connecting board having a plurality of receptacles for receiving plug-in modules;
    at least two metal plates parallel to and spaced from one another and the connecting board, one metal plate being connected to a ground voltage, each other plate being connected to a respective supply voltage potential;
    a plurality of contact areas on the connecting board operably connected to the receptacles; and
    a plurality of connecting elements extending from each metal plate, each connecting element contacting an associated one of the contact areas.

15. The connecting rear wall as claimed in claim 14, wherein each connecting element is a Z-shaped bend of the respective metal plate, offset toward the connecting board.

16. The connecting rear wall as claimed in claim 14, each connecting element having a fastening hole and each contact area having a through-hole aligned with an associated one of the fastening holes, a self-tapping screw being secured through each through-hole and aligned fastening hole.

\* \* \* \* \*